(12) United States Patent
Bicknell et al.

(10) Patent No.: US 7,713,754 B2
(45) Date of Patent: May 11, 2010

(54) METHOD OF FORMING AN AMORPHOUS FERROELECTRIC MEMORY DEVICE

(75) Inventors: Robert Bicknell, Corvallis, OR (US); Timothy Mellander, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 23 days.

(21) Appl. No.: 12/217,657

(22) Filed: Jul. 7, 2008

(65) Prior Publication Data

US 2009/0047747 A1    Feb. 19, 2009

Related U.S. Application Data

(62) Division of application No. 10/955,695, filed on Sep. 30, 2004, now abandoned.

(51) Int. Cl.
*H01L 21/00*    (2006.01)

(52) U.S. Cl. .................. 438/3; 257/295; 257/E27.104; 257/E21.663; 257/E21.664

(58) Field of Classification Search .................. 438/3; 257/295, E27.104, E21.663, E21.664
See application file for complete search history.

(56) References Cited

U.S. PATENT DOCUMENTS

| 5,342,648 | A | * | 8/1994 | MacKenzie et al. | ...... 427/126.3 |
| 5,728,603 | A | * | 3/1998 | Emesh et al. | .................. 438/3 |
| 5,854,499 | A | * | 12/1998 | Nishioka | ..................... 257/295 |
| 5,886,867 | A | * | 3/1999 | Chivukula et al. | .......... 361/311 |
| 6,077,715 | A | * | 6/2000 | Chivukula et al. | ............. 438/3 |
| 6,258,608 | B1 | * | 7/2001 | Jung | ............................. 438/3 |
| 6,309,895 | B1 | * | 10/2001 | Jaing et al. | ..................... 438/3 |
| 6,475,813 | B1 | * | 11/2002 | Li et al. | ......................... 438/3 |

* cited by examiner

*Primary Examiner*—Andy Huynh

(57) ABSTRACT

This disclosure relates to amorphous ferroelectric memory devices and methods for forming them.

9 Claims, 4 Drawing Sheets

METHOD OF FORMING AN AMORPHOUS FERROELECTRIC MEMORY DEVICE

CROSS-REFERENCE TO RELATED APPLICATION

This is a Divisional Application of U.S. patent application Ser. No. 10/955,695, filed Sep. 30, 2004, now abandoned by Robert Bicknell et at. and entitled AMORPHOUS FERROELECTRIC MEMORY DEVICES AND METHODS OF FORMING THE SAME. Applicants claim the benefit of the earlier filing date of U.S. patent application Ser. No. 10/955,695.

TECHNICAL FIELD

This invention relates to a method of forming an amorphous ferroelectric memory device.

BACKGROUND

Ferroelectric memory devices use ferroelectric materials to store information. These materials can store information by retaining a polarization state after exposure to an electric field.

Some of these devices have a sheet of ferroelectric material layered over a conductive layer. A writing device, such as a plate or point, can be used to expose regions of the ferroelectric sheet to an electric field. The plate or point acts to create an electric field in the region by placing a charge over the region opposite the conductive layer. This region is polarized, the polarization state is then retained after the electric field dissipates.

The surface charge of the region can later be read by a reading device. The reading device moves another plate or point over the ferroelectric sheet, thereby reading the polarization state of the regions.

Many of these ferroelectric memory devices use polycrystalline ferroelectric materials to store information. These polycrystalline materials have a grain structure that can make reading their polarization state difficult. This is especially true when reading small regions of the polycrystalline materials because each small region often has a small number of grains. For a region having few grains, the noise from the grain structure interferes with accurate measurement of the region's polarization state.

Also, many ferroelectric memory devices are physically integrated with integrated circuits (ICs). Polycrystalline ferroelectric materials are often fabricated at fairly high temperatures, which can cause problems with neighboring ICs.

Others of these ferroelectric memory devices have single-crystal ferroelectric materials. These single-crystal materials are less likely to have problems associated with noise, but have other significant problems. First, fabricating single-crystal ferroelectric materials is relatively expensive. Second, fabricating them is often performed at high temperatures. These high temperatures can cause significant problems with neighboring ICs. If formed first and then added to an IC, the single crystals may be placed into the IC but this is difficult and expensive, especially if they are small.

BRIEF DESCRIPTION OF THE DRAWINGS

The same numbers are used throughout the disclosure and figures to reference like components and features.

DETAILED DESCRIPTION

Overview

The embodiments described below employ an amorphous ferroelectric material in a memory device. One of these amorphous ferroelectric devices enables its polarization state to be read with low noise. By so doing, large amounts of information can be stored in a very small amount of ferroelectric material.

Also, processes for forming amorphous ferroelectric memory devices are described, which, in some instances, use relatively low-temperature processing. By not relying on higher-temperature processing, amorphous ferroelectric memory devices can be integrally formed with temperature-sensitive devices and structures. One of these processes also enables formation of amorphous ferroelectric materials on or with a temperature-sensitive device using alignment-independent processing steps.

Forming Amorphous Ferroelectric Materials

Figure 1:
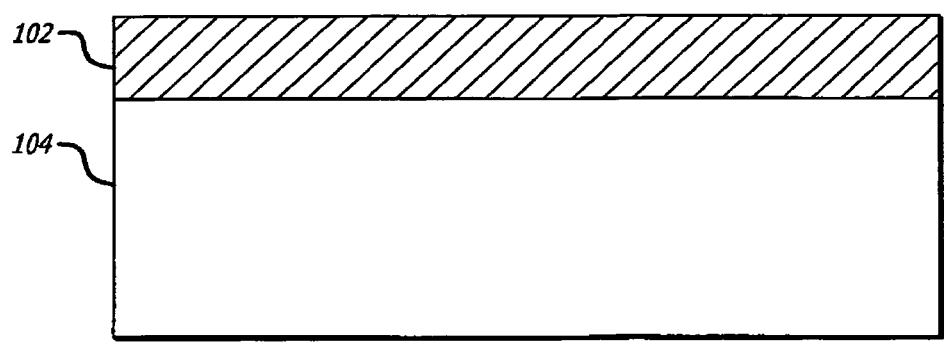
FIG. 1 includes a cross-section of a substrate over which an amorphous ferroelectric material precursor is formed.

Referring initially to FIG. 1, an amorphous ferroelectric precursor 102 is formed over a substrate 104. The amorphous ferroelectric precursor can comprise a ferroelectric compound or its constituent parts and other materials. In the illustrated embodiment, the amorphous ferroelectric precursor comprises lead, zirconium, titanium, and various organic compounds in a Sol-Gel.

The precursor 102 can be formed over substrate 104 using a alignment-independent and/or low-temperature technique. In the illustrated embodiment, the precursor is spun on the substrate at about 25° C. In other embodiments, the precursor is formed using chemical vapor deposition, physical vapor deposition, or another suitable technique.

Figure 2:
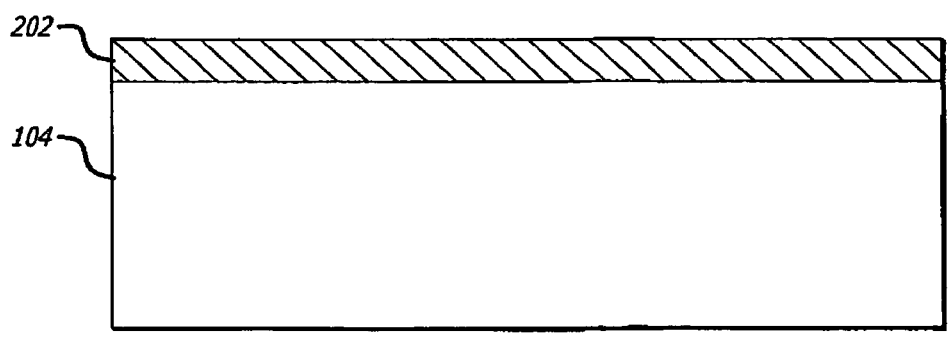
FIG. 2 includes the cross-section of the substrate of FIG. 1 at a processing step subsequent to that shown in FIG. 1.

Referring to FIG. 2, an amorphous ferroelectric material 202 is formed over substrate 104. The amorphous ferroelectric material can be formed as a layer, though other structures can also be used. In one embodiment, the amorphous ferroelectric material comprises lead-zirconium-titanate (Pb$(Zr_{0.5}Ti_{0.5})O_3$) or other suitable ferroelectrics.

The amorphous ferroelectric material 202 can be formed using an alignment-independent and/or low-temperature technique. In the illustrated embodiment, the precursor 102 is heated to about 350° C. This removes most of the organic materials in the Sol Gel and forms a layer of lead-zirconium-titanate. While not shown, the precursor can be disposed within or around a temperature-sensitive device or structure, such as an IC. Thus, the illustrated process enables formation of a ferroelectric material with a temperature-sensitive device or structure capable of withstanding temperatures of about 350° C.

In another embodiment, the amorphous ferroelectric material is formed without first forming the precursor. The amorphous ferroelectric material 202 can be formed first and then placed over the substrate 104 using a suitable alignment-dependent technique, such as a robot capable of accurate placement. The amorphous ferroelectric material can also be formed by physically depositing a vaporized ferroelectric material at low temperature, such as 25° C. to 150° C. This low temperature enables the material to be formed as an amorphous structure. It can also enable formation of the amorphous ferroelectric material within or around a temperature-sensitive device or structure, such as an IC capable of withstanding about 150° C. This alignment-independent technique for forming the amorphous ferroelectric material can be less costly by not requiring a robot or similar device. It may also permit very small sizes or highly accurate placement that is not practicable with an alignment-dependent technique.

Probe-Based Amorphous Ferroelectric Memory Devices

Figure 3:
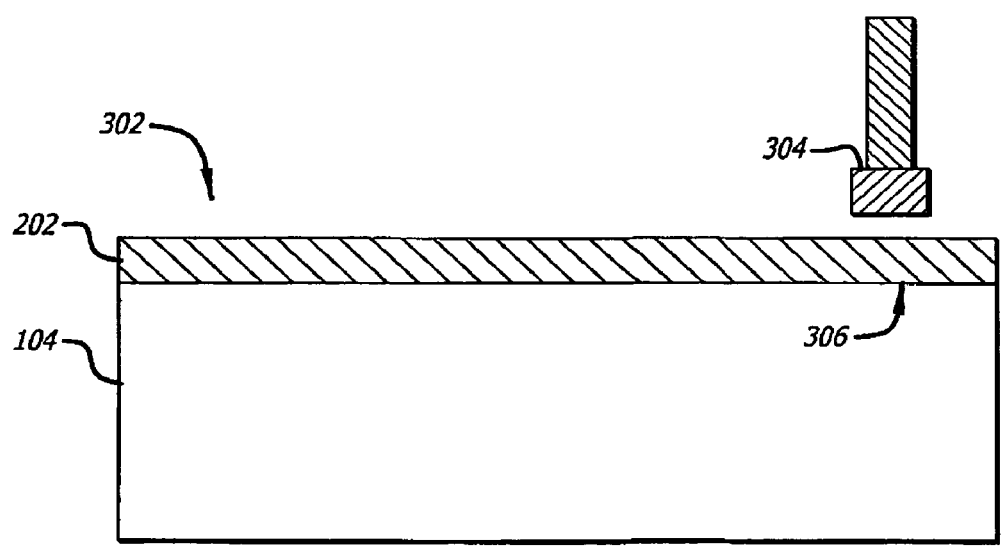
FIG. 3 includes the view FIG. 2 and a charged object for inducing an electric field over a region of an amorphous ferroelectric material.

Referring to FIG. 3, an exemplary probe-based amorphous ferroelectric memory device 302 is formed. In the illustrated embodiment, this probe-based amorphous ferroelectric device comprises substrate 104 and amorphous ferroelectric material 202, both of FIG. 2. When a charged object 304 (here a small plate), is oriented over the amorphous ferroelectric material, a change in the local polarization state is induced in a region 306 between the object and the substrate. The charged object can create one or many millions (even trillions) of charged regions, depending on the object's size and the amorphous ferroelectric material's area. The polarized ("poled") regions can later be read using atomic force microscopy techniques, by scanning the amorphous ferroelectric material's surface potential or capacitance, or other suitable techniques. The amorphous structure of the amorphous ferroelectric material 202 can permit a reading device to read the material's polarization state with less interference from noise than often permitted with a polycrystalline structure. By so doing, the size of regions 306 can be made very small to increase the information density of the memory device.

In the illustrated embodiment, substrate 104 comprises device-grade silicon and the amorphous ferroelectric material 202 is layered to a thickness of about 250 nanometers of lead-zirconium-titanate. The writeability and readability of the illustrated amorphous ferroelectric memory device has been experimentally shown.

Figure 4:
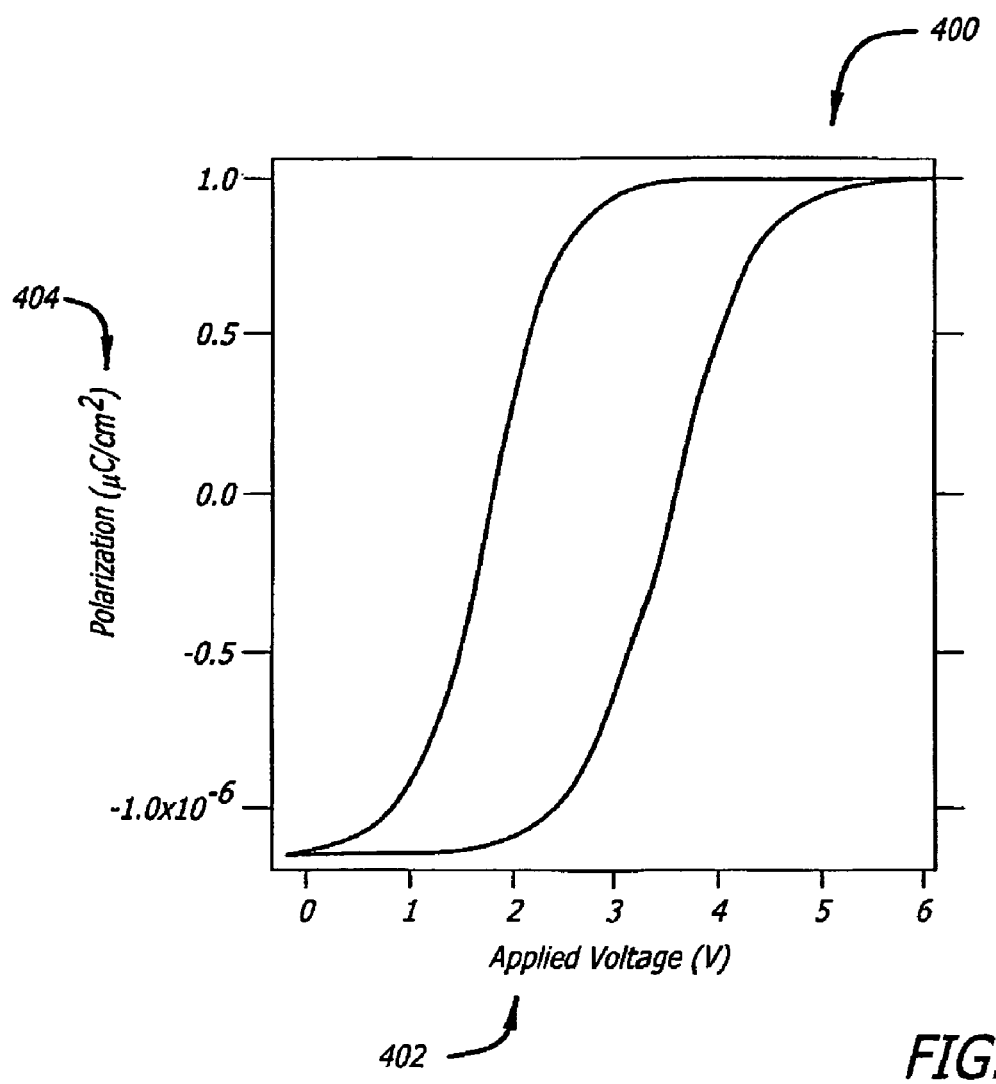
FIG. 4 shows an exemplary polarization hysteresis loop measured on an amorphous ferroelectric material.

FIG. 4 shows a polarization hysteresis loop 400 measured on the amorphous ferroelectric material 202 of FIG. 3. As this figure shows, an applied voltage 402 can be used to store information through a polarization 404 on the amorphous ferroelectric material, which can later be read.

Capacitor-Based Amorphous Ferroelectric Memory Devices

Figure 5:
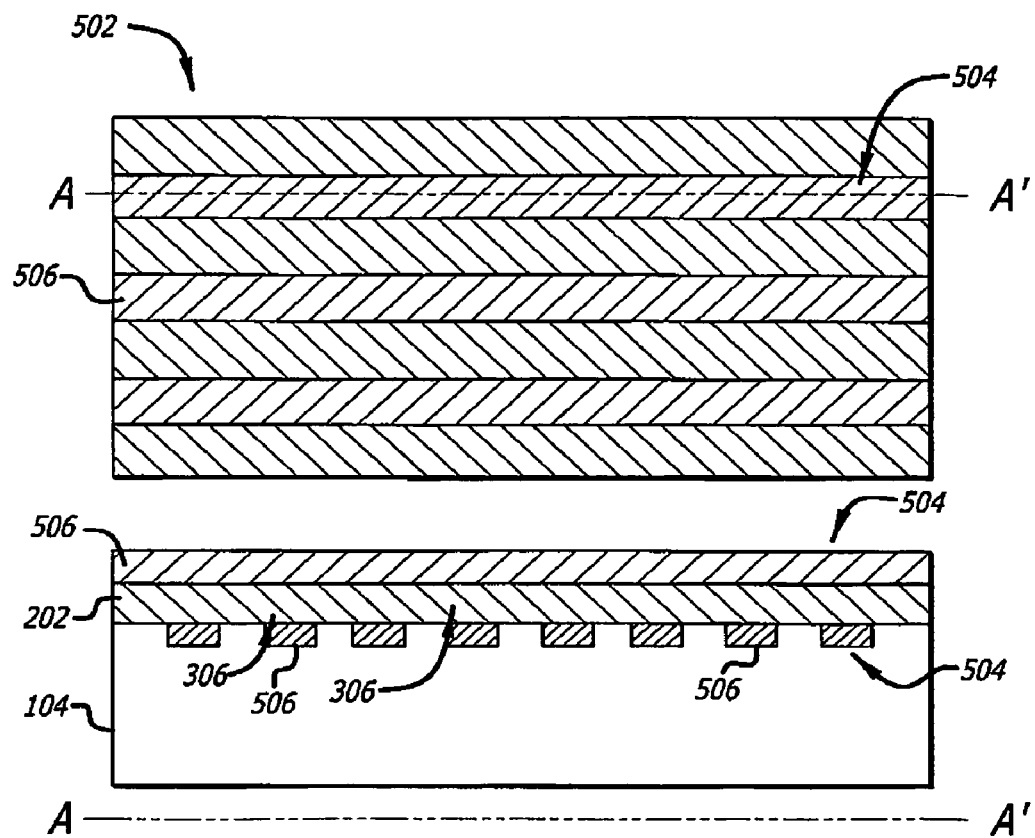
FIG. 5 includes a top-plan and side-sectional views of a cross-bar memory device having an amorphous ferroelectric material.

Referring to FIG. 5, an exemplary capacitor-based amorphous ferroelectric memory device 502 is formed. In the illustrated embodiment, shown in a top-plan and cross-sectional view along A-A', this capacitor-based amorphous ferroelectric device comprises substrate 104 and amorphous ferroelectric material 202, both of FIG. 2. It also comprises a cross-bar structure 504 capable of selectively writing and reading the regions 306 residing between intersection areas of cross-bars 506 of the cross-bar structure. This device can be integrally formed with a temperature-sensitive device or structure, such as an IC.

Although the invention is described in language specific to structural features and methodological steps, it is to be understood that the invention defined in the appended claims is not necessarily limited to the specific features or steps described. Rather, the specific features and steps disclosed represent exemplary forms of implementing the claimed invention.

What is claimed is:

1. A method for forming a memory device comprising the steps of:
    forming a substrate;
    forming an amorphous ferroelectric precursor over the substrate at a temperature of about 25° C.; and
    heating the amorphous ferroelectric precursor to a temperature of about 350° C. to remove organic materials from the amorphous ferroelectric precursor and to form an amorphous ferroelectric material on the substrate.

2. The method for forming a memory device of claim 1, wherein the amorphous ferroelectric precursor is spun on the substrate.

3. The method for forming a memory device of claim 1 wherein:
    the amorphous ferroelectric material comprises lead, zirconium, and titanium in a sol-gel.

4. A method for forming a memory device comprising the steps of:
    forming an amorphous ferroelectric material;
    vaporizing the amorphous ferroelectric material;
    physically depositing the vaporized amorphous ferroelectric material over a substrate at a temperature range from 25° C. to 150° C.; and
    forming the amorphous ferroelectric material around a temperature-sensitive integrated circuit (IC) capable of withstanding a temperature of about 150° C.

5. The method for forming a memory device of claim 4 wherein:
    the amorphous ferroelectric material comprises lead, zirconium and titanium.

6. The method for forming a memory device of claim 1 further comprising:
    disposing the amorphous ferroelectric precursor around a temperature-sensitive integrated circuit (IC) capable of withstanding a temperature of about 350° C.

7. The method for forming a memory device of claim 1 wherein:
    the amorphous ferroelectric material comprises lead-zirconium-titanate ($Pb(Zr_{0.5}Ti_{0.5})O_3$).

8. The method for forming a memory device of claim 4 further comprising:
    forming the amorphous ferroelectric material with an alignment-independent technique that does not require a robot.

9. The method for forming a memory device of claim 4 wherein:
    the substrate comprises silicon, and the amorphous ferroelectric material is layered to a thickness of about 250 nanometers of lead-zirconium-titanate.

* * * * *